United States Patent
Kobayashi

(10) Patent No.: US 8,982,529 B2
(45) Date of Patent: Mar. 17, 2015

(54) SUBSTRATE MOUNTING AND DEMOUNTING METHOD

(75) Inventor: Yoshiyuki Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 372 days.

(21) Appl. No.: 13/049,340

(22) Filed: Mar. 16, 2011

(65) Prior Publication Data
US 2011/0228439 A1  Sep. 22, 2011

Related U.S. Application Data

(60) Provisional application No. 61/325,642, filed on Apr. 19, 2010.

(30) Foreign Application Priority Data

Mar. 17, 2010 (JP) ................... 2010-061402

(51) Int. Cl.
*H01L 21/683* (2006.01)
*H01L 21/67* (2006.01)

(52) U.S. Cl.
CPC ...... *H01L 21/6831* (2013.01); *H01L 21/67109* (2013.01)
USPC .......................................... 361/234

(58) Field of Classification Search
CPC ............ H01L 21/6833; H01L 21/6831; H01L 21/67109; H02N 13/00; G03F 7/70708
USPC ................................ 361/361, 234
See application file for complete search history.

(56) References Cited

U.S. PATENT DOCUMENTS

| 5,548,470 | A | * | 8/1996 | Husain et al. | ................ | 361/234 |
| 5,684,669 | A | * | 11/1997 | Collins et al. | ................ | 361/234 |
| 2004/0188021 | A1 | * | 9/2004 | Mitrovic | ................ | 156/345.52 |

FOREIGN PATENT DOCUMENTS

| JP | 10-163308 A | 6/1998 |
| JP | 11-297802 A | 10/1999 |
| JP | 2001-152335 | 6/2001 |
| JP | 2002-270680 A | 9/2002 |
| JP | 2005-64460 A | 3/2005 |
| JP | 2005-72521 A | 3/2005 |
| JP | 2009-239062 A | 10/2009 |

* cited by examiner

*Primary Examiner* — Jared Fureman
*Assistant Examiner* — Nicholas Ieva
(74) *Attorney, Agent, or Firm* — Oblon, Spivak, McClelland, Maier & Neustadt, L.L.P.

(57) ABSTRACT

A substrate mounting and demounting method that can prevent fine particles from getting stuck in a rear surface of a substrate. A substrate processing apparatus that implements the substrate mounting and demounting method has an electrostatic chuck that has therein an electrode plate to which a DC voltage is applied, and attracts and holds a substrate through an electrostatic force generated due to the applied DC voltage, and a heat-transmitting gas supply unit that supplies a heat-transmitting gas into a gap between the attracted and held substrate and the electrostatic chuck. When the DC voltage applied to the electrode plate is increased while being gradually changed, the pressure of the supplied heat-transmitting gas is increased in stages in response to the increase in the DC voltage.

20 Claims, 6 Drawing Sheets

SUBSTRATE MOUNTING AND DEMOUNTING METHOD

BACKGROUND OF THE INVENTION

1. Field of the Invention

The present invention relates to a substrate mounting and demounting method implemented by a substrate processing apparatus having an electrostatic chuck that attracts a substrate through electrostatic force.

2. Description of the Related Art

In substrate processing apparatuses, a number of particles may become attached to a rear surface of a wafer as a substrate having been subjected to plasma etching processing. The particles attached to the rear surface of the wafer cause defocusing in a lithography process in which a photoresist coated on a front surface of the wafer is hardened by light.

To cope with this, conventionally, by cleaning the rear surface of the wafer subjected to the plasma etching processing, or by changing the material of a member coming into contact with the rear surface of the wafer in the substrate processing apparatus, a number of particles have been prevented from becoming attached to the rear surface of the wafer before the lithography process.

In the substrate processing apparatus, when the wafer is to be subjected to the plasma etching processing, the wafer is housed in a processing chamber, and mounted on a mounting stage disposed inside the processing chamber. An electrostatic chuck is provided on an upper portion of the mounting stage which comes into contact with the wafer. The electrostatic chuck has therein an electrode plate, and attracts and holds the wafer through an electrostatic force generated by a DC voltage applied to the electrode plate.

Usually, a high DC voltage that generates an electrostatic force is suddenly applied to the electrostatic chuck, the wafer is suddenly attracted to the electrostatic chuck. Thus, there may be cases where the wafer becomes distorted and attracted as it is to the electrostatic chuck, and a stress is generated on a surface of the wafer which contacts the electrostatic chuck (hereafter referred to as "the contact surface of the wafer") or a surface of the electrostatic chuck which contacts the wafer (hereafter referred to as "the contact surface of the electrostatic chuck") due to a restoring force of the distorted wafer.

In general, ceramics is thermally sprayed to a surface of the electrostatic chuck, and there are several structurally fragile parts in the surface of the electrostatic chuck. For this reason, the stress generated on the contact surface of the electrostatic chuck breaks the fragile parts, causing particles to be produced, and these particles get stuck in the rear surface of the wafer. Moreover, when the stress generated on the contact surface of the wafer rapidly changes, the wafer may crack.

As an example of a wafer attracting and holding method for preventing the wafer from cracking, a method that gradually increases a DC voltage applied to the electrode plate of the electrostatic chuck has been proposed (see Japanese Laid-Open Patent Publication (Kokai) No. 2001-152335, for example,). This can prevent a stress from rapidly changing, and prevent the wafer from cracking.

However, it is very difficult to remove the particles stuck on the rear surface of the wafer by cleaning. Moreover, as described above, even if the DC voltage applied to the electrode plate of the electrostatic chuck is gradually increased, a stress is generated on the contact surface of the electrostatic chuck as long as the wafer becomes distorted, and as a result, particles cannot be prevented from becoming attached to and getting stuck in the rear surface of the wafer.

SUMMARY OF THE INVENTION

It is an object of the present invention to provide a substrate mounting and demounting method that can prevent fine particles from getting stuck in a rear surface of a substrate.

A first aspect of the present invention can provide a substrate mounting and demounting method implemented by a substrate processing apparatus, which has an electrostatic chuck that has therein an electrode plate to which a DC voltage is applied, and attracts and holds a substrate through an electrostatic force generated due to the applied DC voltage, and a heat-transmitting gas supply unit that supplies a heat-transmitting gas into a gap between the attracted and held substrate and the electrostatic chuck, comprising: when increasing the DC voltage applied to the electrode plate while gradually changing the same, increasing a pressure of the supplied heat-transmitting gas in stages in response to the increase in the DC voltage.

According to the first aspect of the present invention, when the DC voltage applied to the electrode plate is increased while being gradually changed, the pressure of the supplied heat-transmitting gas is increased in stages in response to the increase in the DC voltage, which makes it possible to reduce the difference between an electrostatic force that causes the substrate to be attracted to and held on the electrostatic chuck (hereafter referred to merely as the "electrostatic force") and a separating force that is given to the substrate and separates the substrate from the electrostatic chuck (hereafter referred to merely as "the separating force"). Moreover, the separating force acts in an opposite direction to the electrostatic force with respect to the substrate, and hence the separating force relieves the electrostatic force. Therefore, when the substrate is attracted to and held on the electrostatic chuck, the electrostatic force can be significantly relieved, and the substrate can be prevented from becoming distorted. This can prevent a stress from being generated in a part of the electrostatic chuck which contacts the substrate, and prevent fine particles from getting stuck in a rear surface of the substrate.

The first aspect of the present invention can provide a substrate mounting and demounting method, wherein a separating force that separates the substrate from the electrostatic chuck, which is given to the substrate by the supplied heat-transmitting gas, never exceeds the electrostatic force.

The first aspect of the present invention can provide a substrate mounting and demounting method, wherein the DC voltage as well is increased in stages.

The first aspect of the present invention can provide a substrate mounting and demounting method, wherein each stage in which the pressure of the heat-transmitting gas is increased is started later than each stage in which the applied voltage is increased.

The first aspect of the present invention can provide a substrate mounting and demounting method, wherein in each stage in which the pressure of the heat-transmitting gas is increased, the pressure of the supplied heat-transmitting gas is maintained at a constant value for at least 10 seconds.

The first aspect of the present invention can provide a substrate mounting and demounting method, wherein the substrate is comprised mainly of silicon, and a contact portion of the electrostatic chuck which attracts and contacts the substrate is covered with ceramics.

A second aspect of the present invention can provide a substrate mounting and demounting method implemented by a substrate processing apparatus, which has an electrostatic chuck that has therein an electrode plate to which a DC voltage is applied, and attracts and holds a substrate through an electrostatic force generated due to the applied DC voltage, and a heat-transmitting gas supply unit that supplies a heat-transmitting gas into a gap between the attracted and held substrate and the electrostatic chuck, comprising: when decreasing the DC voltage applied to the electrode plate while gradually changing the same after causing the substrate to be attracted to and held on the electrostatic chuck and supplying the heat-transmitting gas into the gap between the attracted and held substrate and the electrostatic chuck, decreasing a pressure of the supplied heat-transmitting gas in stages in response to the decrease in the DC voltage.

According to the second aspect of the present invention, when the DC voltage applied to the electrode plate is decreased while being gradually changed, the pressure of the supplied heat-transmitting gas is decreased in stages in response to the decrease in the DC voltage, which makes it possible to reduce the difference between the electrostatic force and the separating force, and therefore, when the substrate is attracted to and held on the electrostatic chuck, the electrostatic force can be significantly relieved, and the substrate can be prevented from becoming distorted. This can prevent a stress from being generated in a part of the electrostatic chuck which contacts the substrate, and prevent fine particles from getting stuck in a rear surface of the substrate.

The second aspect of the present invention can provide a substrate mounting and demounting method, wherein a separating force that separates the substrate from the electrostatic chuck, which is given to the substrate by the supplied heat-transmitting gas, never exceeds the electrostatic force.

The second aspect of the present invention can provide a substrate mounting and demounting method, wherein the DC voltage as well is increased in stages.

The second aspect of the present invention can provide a substrate mounting and demounting method, wherein each stage in which the pressure of the heat-transmitting gas is increased is started later than each stage in which the applied voltage is increased.

The second aspect of the present invention can provide a substrate mounting and demounting method, wherein in each stage in which the pressure of the heat-transmitting gas is increased, the pressure of the supplied heat-transmitting gas is maintained at a constant value for at least 10 seconds.

The second aspect of the present invention can provide a substrate mounting and demounting method, wherein the substrate is comprised mainly of silicon, and a contact portion of the electrostatic chuck which attracts and contacts the substrate is covered with ceramics.

Further features of prevent the invention will become apparent from the following description of exemplary embodiments with reference to the attached drawings.

BRIEF DESCRIPTION OF THE DRAWINGS

FIGS. 2A and 2B are views useful in explaining a manner of stress being generated on a rear surface of a wafer and an attracting surface of an electrostatic chuck when the water is attracted to the electrostatic chuck, in which FIG. 2A shows force acting on the wafer before the attraction of the water.

FIGS. 3A and 3B are views useful in explaining the substrate mounting and demounting method according to the present embodiment implemented when the water is attracted to and held on the electrostatic chuck, in which FIG. 3A shows a case where applied voltage is increased while being uniformly and gradually changed, and FIG. 3B shows a case where applied voltage is increased in stages.

FIGS. 5A and 5B are views useful in explaining the substrate mounting and demounting method according to the present embodiment implemented when the water is removed from the electrostatic chuck, in which FIG. 5A shows a case where applied voltage is lowered while being uniformly and gradually changed, and FIG. 3B shows a case where applied voltage is lowered in stages.

DETAILED DESCRIPTION OF PREFERRED EMBODIMENTS

The present invention will now be described in detail with reference to the drawings showing an embodiment thereof.

First, a description will be given of a substrate processing apparatus that implements a substrate mounting and demounting method according to the present embodiment.

Figure 1:
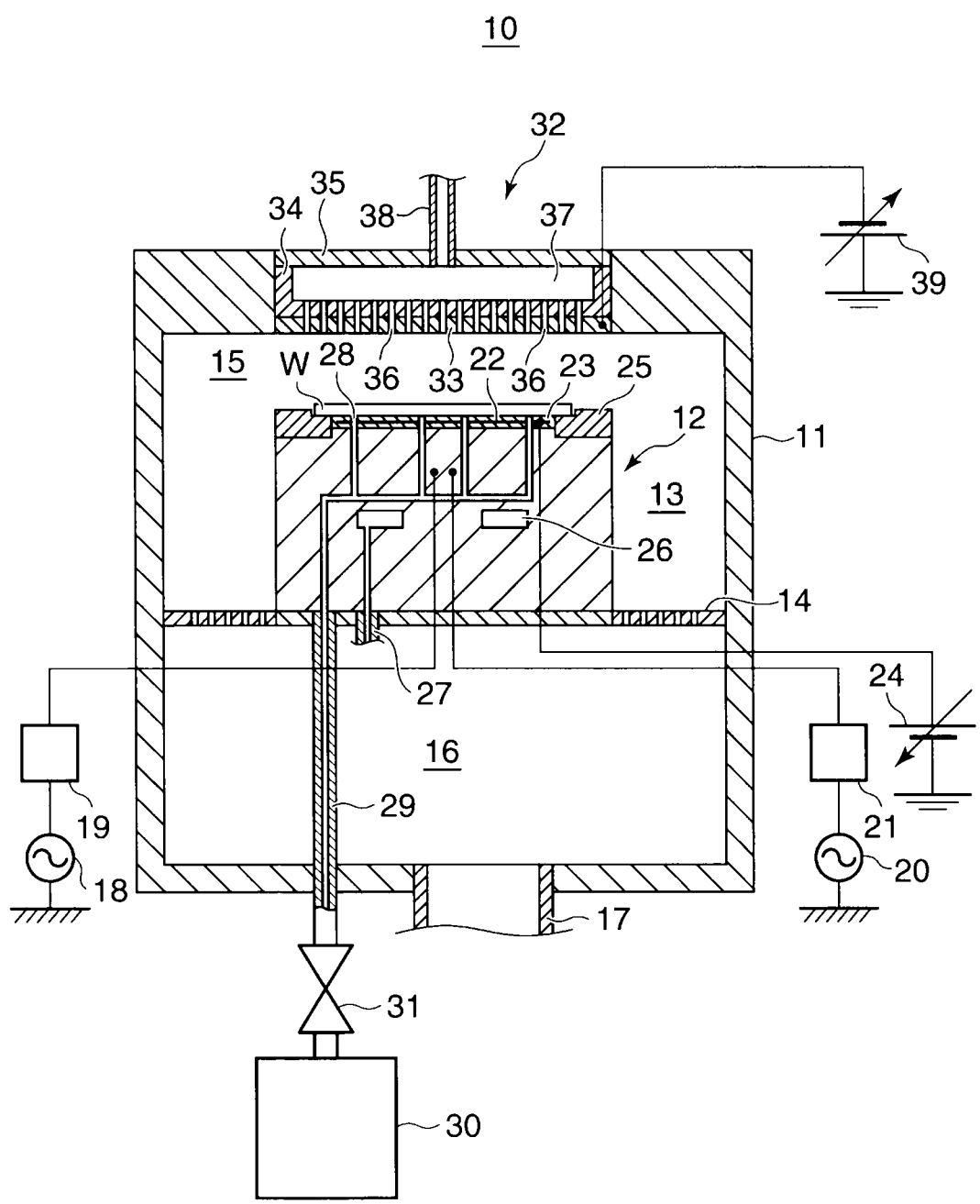
FIG. 1 is a sectional view schematically showing the construction of a substrate processing apparatus that implements a substrate mounting and demounting method according to an embodiment of the present invention.

FIG. 1 is a sectional view schematically showing the construction of the substrate processing apparatus that implements the present substrate mounting and demounting method according to the present embodiment. The substrate processing apparatus carries out plasma etching processing on a semiconductor device wafer (hereafter referred to merely as "the wafer") made of silicon as a substrate.

Referring to FIG. 1, the substrate processing apparatus 10 has, for example, a chamber 11 in which a wafer W having a diameter of, for example, 300 mm is accommodated, and a cylindrical susceptor 12 (mounting stage) on which is mounted a wafer W is mounted is disposed in the chamber 11. In the substrate processing apparatus 10, an exhaust path 13 is formed between an inside wall of the chamber 11 and a side face of the susceptor 12. An exhaust plate 14 is disposed part way along the exhaust path 13.

The exhaust plate 14, which is a plate-like member having a number of through holes, acts as a partition plate that partitions the interior of the chamber 1 into an upper portion and a lower portion. As will be described later, plasma is produced in the upper portion (hereafter referred to as "the processing chamber") of the chamber 11 partitioned by the exhaust plate 14. Moreover, an exhaust pipe 17 that exhausts gas out from the chamber 11 is connected to the lower portion (hereafter referred to as "the exhaust chamber (manifold)") 16 of the chamber 11. Moreover, the exhaust plate 14 captures or reflects plasma produced in the processing chamber 15, thus preventing leakage of the plasma into the manifold 16.

The exhaust pipe 17 has a TMP (turbo-molecular pump) (not shown) and a DP (dry pump) (not shown) connected thereto, and these pumps reduce the pressure in the chamber 11*d* down to a vacuum state. Specifically, the DP reduces the pressure in the chamber 11 from atmospheric pressure down to an intermediate vacuum state (e.g. a pressure of not more than $1.3 \times 10$ Pa (0.1 torr), and the TMP is operated in collaboration with the DP to reduce the pressure in the chamber 11 from atmospheric pressure down to a high vacuum state (e.g. a pressure of not more than $1.3 \times 10^{-3}$ Pa ($1.0 \times 10^{-5}$ torr)), which is at a lower pressure than the intermediate vacuum state. It should be noted that an APC valve (not shown) controls the pressure in the chamber 11.

A first radio frequency power source 18 is connected to the susceptor 12 in the chamber 11 via a first matcher 19, and a second radio frequency power source 20 is connected to the susceptor 12 in the chamber 11 via a second matcher 21. The first radio frequency power source 18 applies ion-attracting radio frequency electrical power of a relatively low frequency, for example, 2 MHz to the susceptor 12, and the second radio frequency power source 20 applies plasma-producing radio frequency electrical power of a relatively high frequency, for example, 60 MHz to the susceptor 12. The susceptor 12 thus acts as an electrode. The first matcher 19 and the second matcher 21 reduce reflection of the radio frequency electrical power from the susceptor 12 so as to maximize the efficiency of the supply of the radio frequency electrical power into the susceptor 12.

An upper portion of the susceptor 12 is shaped such that a smaller diameter cylindrical column projects from an end of a larger diameter cylindrical column concentrically with the larger diameter cylindrical column, and a step is formed in the upper portion of the susceptor 12 so as to surround the smaller diameter cylindrical column. An electrostatic chuck 23 having an electrostatic electrode plate 22 therein is provided at an end of the smaller diameter cylindrical column. A DC power source 24 is connected to the electrostatic electrode plate 22, and a high positive DC voltage is applied to the electrostatic electrode plate 22. Upon a positive DC voltage being applied to the electrostatic electrode plate 22, a negative potential is produced on a surface of the wafer W on the electrostatic chuck 23 side (hereafter referred to as "the rear surface"). A potential difference thus arises between the electrostatic electrode plate 22 and the rear surface of the wafer W, and hence the wafer W is attracted to and held on the electrostatic chuck 23 through an electrostatic force, for example, a Coulomb force or a Johnsen-Rahbek force due to the potential difference.

A focus ring 25 is provided on the step in the upper portion of the susceptor 12 so as to surround the wafer W attracted to and held on the electrostatic electrode plate 22. The focus ring 25 is made of, for example, silicon (Si) or silicon carbide (SiC). Namely, because the focus ring 25 is made of a semi-conductive material, the focus ring 25 broadens the distribution region of plasma to not only the wafer W but also the focus ring 25, thus maintaining the density of plasma on a peripheral edge of the wafer W at the same level as the density of plasma on a central portion of the wafer W. This ensures uniformity of the plasma etching processing performed on the entire surface of the wafer W.

An annular coolant chamber 26 that extends, for example, in a circumferential direction of the susceptor 12 is provided inside the susceptor 12. A coolant, for example cooling water or a Galden (registered trademark) fluid, at a predetermined temperature is circulated through the coolant chamber 26 via coolant piping 27 from a chiller unit (not shown).

The electrostatic chuck 23 has a plurality of heat-transmitting gas supply holes 28 (heat-transmitting gas supply unit) opening to the wafer W attracted to and held on the electrostatic chuck 23. The heat-transmitting gas supply holes 28 are connected to a heat-transmitting gas supply unit 30 by a heat-transmitting gas supply line 29. The heat-transmitting gas supply unit 30 supplies helium (He) gas as a heat-transmitting gas via the heat-transmitting gas supply holes 28 into a gap between a surface of the electrostatic chuck 23 which contacts the wafer W attracted to and held on the electrostatic chuck 23 (hereafter referred to as "the attracting surface") and the rear surface of the wafer W. The heat-transmitting gas supply line 29 has a valve 31, and the valve 31 and the heat-transmitting gas supply unit 30 control the flow rate and pressure of the heat-transmitting gas supplied into the gap.

A shower head 32 is disposed in a ceiling portion of the chamber 11 so as to face the susceptor 12. The shower head 32 has an upper electrode plate 33, a cooling plate that removably suspends the upper electrode plate 33, and a lid 35 that covers the cooling plate 34. The upper electrode plate 33 is comprised of a disk-shaped member having a number of gas holes 36, which pass therethrough in the direction of thickness, and made of silicon which is a semi-conductive material. A buffer chamber 37 is provided inside the cooling plate 34, and a processing gas introducing pipe 38 is connected to the buffer chamber 37.

A DC power source 39 is connected to the upper electrode plate 33 of the shower head 32, and applies a negative DC voltage to the upper electrode plate 33. The upper electrode plate 33 emits secondary electrons to prevent the density of electrons in the processing chamber 15 from decreasing.

In the substrate processing apparatus 10, a processing gas supplied from the processing gas introducing pipe 38 to the buffer chamber 37 is introduced into the processing chamber 15, and the introduced processing gas is excited and turned into plasma by the plasma-producing radio frequency electrical power applied into the processing chamber 15 from the second radio frequency electrical power source 20 via the susceptor 12. Ions in the plasma are attracted toward the wafer W by the ion-attracting radio frequency electrical power applied to the susceptor 12 by the second radio frequency electrical power source 18, whereby the wafer W is subjected to the plasma etching processing by the ions.

Operation of the component elements of the substrate processing apparatus 10 described above is controlled in accordance with a program for the plasma etching processing by a CPU of a control unit (not shown) of the substrate processing apparatus 10.

In the substrate processing apparatus 10 described above, when the wafer W is subjected to the plasma etching processing, the temperature of the wafer W increases due to heat input from the plasma. When the temperature of the wafer W unnecessarily increases, an unnecessary chemical reaction occurs between a surface of the wafer W and radicals. Moreover, a thermal stress on the wafer W may increase, eventually causing the wafer W to crack.

For this reason, when the wafer W is to be subjected to the plasma etching processing, the wafer W is attracted to and held on the electrostatic chuck 23. At this time, the susceptor 12 has been cooled by the coolant in the coolant chamber 26, heat of the wafer W is transmitted to the susceptor 12, and thus cooled.

However, the electrostatic chuck 23 is generally comprised of a laminated body of ceramics (such as alumina) including the electrostatic electrode plate 22, or a member comprised of two dielectric members whose surfaces are covered with ceramics (such as yttria), and hence there is a minute gap between the attracting surface and the rear surface of the wafer W (hereafter referred to as "the heat transmission gap"). Thus, only by attracting and holding the wafer W, heat of the wafer W cannot be satisfactorily transmitted to the susceptor 12. To cope with this, in general, when the wafer W is to be subjected to the plasma etching processing, a helium gas is supplied from the heat-transmitting gas supply holes 28 into the heat-transmission gap. The helium gas effectively transmits the heat of the wafer W, and thus the heat of the wafer W can be satisfactorily transmitted to the susceptor 12. This prevents the temperature of the wafer W from unnecessarily increasing.

Figure 2A:
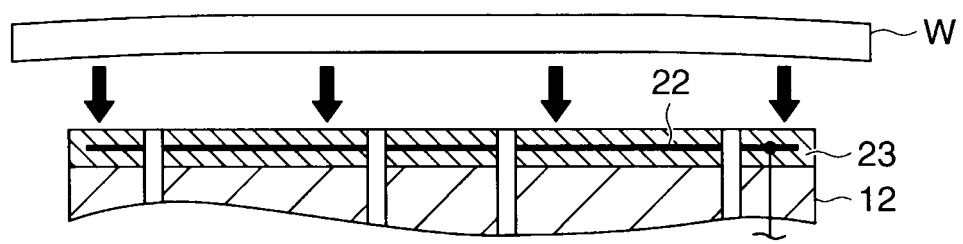
Figure 2B:
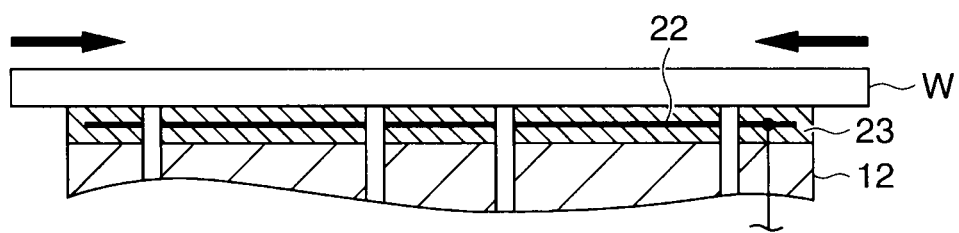

As described above, to cool the wafer W by the susceptor 12, the wafer W has to be attracted to and held on the electrostatic chuck 23, but if a positive DC voltage is suddenly applied to the electrostatic electrode plate 22, the wafer W is suddenly drawn toward the electrostatic chuck 23 through an electrostatic force. As a result, the wafer W becomes distorted, and the distorted wafer W attracted to and held on the electrostatic chuck 23 tries restore to original state. For example, the wafer W tries to expand in a radial direction. However, because the wafer W is attracted to and held on the electrostatic chuck 23, a force that pulls the wafer W back toward the center (see arrows in the figure) acts on the wafer W as shown in FIG. 2B, and as a result, a stress is generated on the wafer W, particularly, the rear surface of the wafer W. Also, as a reaction to the stress, a stress is generated on the attracting surface of the electrostatic chuck 23. This stress breaks structurally fragile parts of the attracting surface of the electrostatic chuck 23 covered with ceramics, and thus produces particles of ceramics. At this time, because the wafer W is attracted to and held on the electrostatic chuck 23, the produced particles get stuck in the rear surface of the wafer W.

Figure 3A:
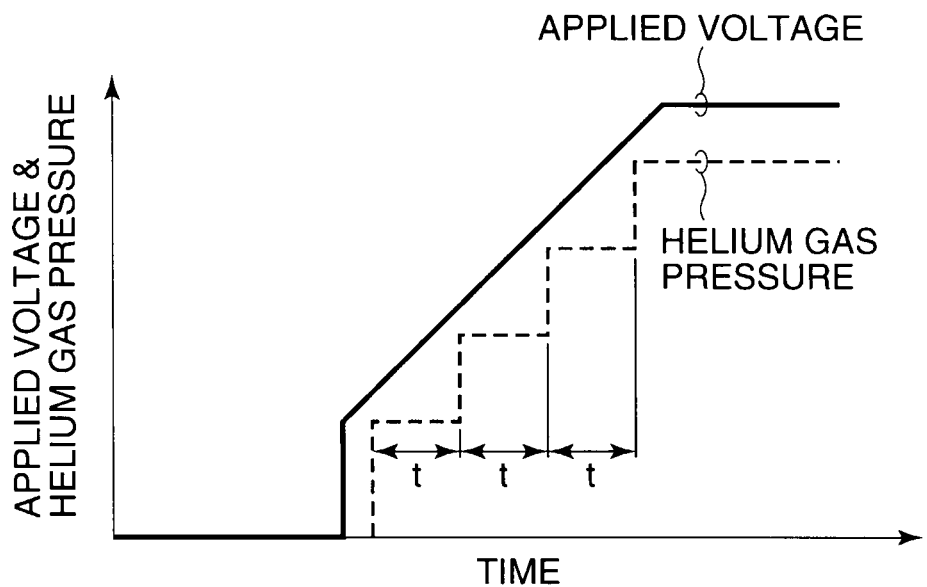

To cope with this, the substrate mounting and demounting method according to the present embodiment prevents a stress from being generated on the attracting surface of the electrostatic chuck 23 when the wafer W is attracted to and held on the electrostatic chuck 23. Specifically, as shown in FIG. 3A, when the wafer W is attracted to and held on the electrostatic chuck 23, a positive DC voltage applied to the electrostatic electrode plate 22 (hereafter referred to as "the applied voltage") is increased while being gradually changed, and the pressure of a helium gas supplied into the heat transmission gap (hereafter referred to as "the supplied helium gas pressure") is increased in a staircase pattern (in stages) in response to the increase in the applied voltage.

By increasing the applied voltage while gradually changing the same, the wafer W can be prevented from being suddenly drawn toward the electrostatic chuck 23 through an electrostatic force.

Moreover, under normal circumstances, when the helium gas is supplied into the heat transmission gap, the pressure in the heat transmission gap increases, and a force that separates the wafer W from the attracting surface of the electrostatic chuck 23 acts on the wafer W (hereafter referred to as "the separating force"). The separating force acts in an opposite direction to the electrostatic force with respect to the wafer W, and thus relieves the electrostatic force acting on the wafer W. Because the substrate mounting and demounting method according to the present embodiment increases the supplied helium gas pressure in a staircase pattern in response to the increase in the applied voltage, the difference between the electrostatic force and the separating force can be made small. Therefore, the electrostatic force acting on the wafer W can be significantly relieved, and when the wafer W is attracted to and held on the electrostatic chuck 23, the wafer W can be prevented from becoming distorted.

This can prevent a stress from being generated on the rear surface of the wafer W and the attracting surface of the electrostatic chuck 23. As a result, structurally fragile parts of the attracting surface of the electrostatic chuck 23 are not broken, and particles of ceramics are not produced, and hence particles can be prevented from getting stuck in the rear surface of the wafer W.

Moreover, the substrate mounting and demounting method according to the present embodiment provides control such that the separating force does not exceed the electrostatic force when increasing the applied voltage while gradually changing the same. Specifically, the supplied helium gas pressure is controlled by the valve 31 and the heat-transmitting gas supply unit 30 so that the separating force Q can satisfy an expression (1) given below. As a result, the wafer W can be prevented from being separated from the electrostatic chuck 23.

$$Q \leq 1/(2k) \times \in \times \in_0 \times (V/d)^2 \times S \qquad (1)$$

Here, k designates a safety factor, c is a dielectric constant of the electrostatic chuck 23, V is a value of the applied voltage, $\in_0$ is a dielectric constant of vacuum, and d is a distance between the electrostatic electrode plate 22 and the wafer W, and S is a surface area of the rear surface of the wafer W. Further, the substrate mounting and demounting method according to the present embodiment controls the supplied helium gas pressure using the valve 31 and the heat-transmitting gas supply unit 30 so that when the supplied helium gas pressure is increased in a staircase pattern, the supplied helium gas pressure can be maintained at a constant value for a predetermined time period t, for example, at least 10 seconds in each stage as shown in FIG. 3A. In general, it takes a certain period of time for the pressure of gas in a space to become stable. Thus, by providing control so that the supplied helium gas pressure can be maintained at a constant value for at least 10 seconds, the supplied helium gas pressure in the heat transmission gap can be made stable. Moreover, because the supplied helium gas pressure in the heat transmission gap is stable, variations in the difference between the electrostatic force and the separating force can be reduced in each stage when the supplied helium gas pressure is increased in a staircase pattern, and hence inadvertent separation of the wafer W from the electrostatic chuck 23 can be prevented.

Figure 3B:
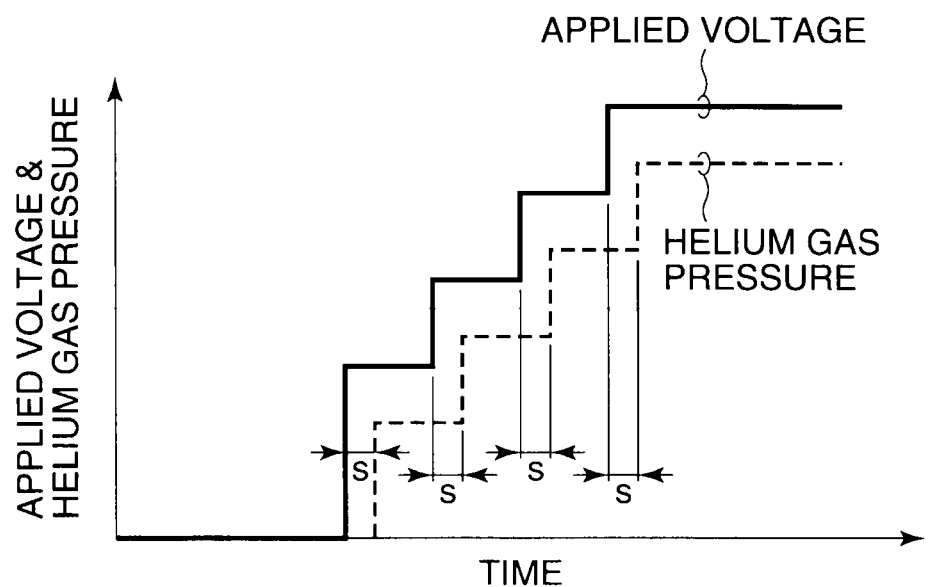
FIG. 3B shows force acting on the wafer after the attraction of the water.

Moreover, the substrate mounting and demounting method according to the present embodiment preferably increases the applied voltage in stages when increasing the applied voltage while gradually changing the same as shown in FIG. 3B. This can prevent the difference between the electrostatic force and the separating force from unnecessarily increasing when the wafer W is attracted to and held on the electrostatic chuck 23, and thus can reliably prevent the wafer W from becoming distorted.

When the applied voltage is increased in stages, the number of stages in which the applied voltage is increased is preferably the same as the number of stages in which the supplied helium gas pressure is increased, and also, the duration of each stage in which the applied voltage is increased is preferably the same as the duration of each stage in which the supplied helium gas pressure is increased. This can maintain the difference between the electrostatic force and the separating force substantially constant when the wafer W is attracted to and held on the electrostatic chuck 23. As a result, the wafer W can be attracted to and held on the electrostatic chuck 23 in a stable manner, and varying stress can be prevented from acting on the wafer W.

Further, when increasing the applied voltage in stages, the substrate mounting and demounting method according to the present embodiment preferably starts each stage in which the supplied helium gas pressure is increased later than, for example as shown in FIG. 3B, a time period s later than the corresponding stage in which the applied voltage is increased. This can reliably prevent the separating force from exceeding the electrostatic force when the wafer W is attracted to and held on the electrostatic chuck 23.

It should be noted that the greater the number of stages in which the supplied helium gas pressure is increased, the greater is the extent to which variations in the resultant of the electrostatic force and the separating force acting on the wafer W are reduced, but it takes time to increase the supplied helium gas pressure to a processing pressure. Thus, the number of stages in which the supplied helium gas pressure is increased is preferably limited to a few, for example, two or three.

Moreover, by increasing the supplied helium gas pressure in stages, variations in the pressure of the helium gas in the heat-transmitting gas supply line 29 can be reduced. This can prevent deposit attached to an inner wall of the heat-transmitting gas supply line 29, a valve element of the valve 31, and so on from peeling off, and hence peeling deposit can be prevented from being transferred into the heat transmission gap by the helium gas, and becoming attached as particles to the rear surface of the wafer W.

Figure 4:
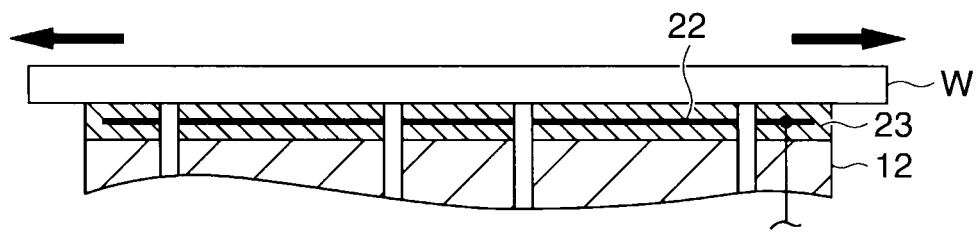
FIG. 4 is a view useful in explaining a force acting on the wafer when the wafer is removed from the electrostatic chuck.

In the substrate processing apparatus 10 described above, when the plasma etching processing is to be performed on the wafer W, the temperature of the wafer W increases due to heat input from plasma, and hence as shown in FIG. 4, the wafer W tends to thermally expand by an amount consistent with a thermal expansion coefficient of silicon (see arrows in the figure). However, the wafer W is attracted to and held on the electrostatic chuck 23, which does not thermally expand like the wafer W because the electrostatic chuck 23 is comprised principally of ceramics. Thus, the wafer W cannot thermally expand, and as a result, an internal stress is generated inside the wafer W.

If the positive DC voltage applied to the electrostatic electrode plate 22 is sharply decreased when the wafer W is removed from the electrostatic chuck 23 by extinguishing the electrostatic force after the plasma etching processing is completed, the wafer W is released and suddenly deformed by the internal stress to suddenly expand, for example, in directions indicated by the arrows in FIG. 4, so that the rear surface of the wafer W rub against the attracting surface of the electrostatic chuck 23 hard. At this time, structurally fragile parts of the attracting surface may be broken, causing particles of ceramics to get stuck in the rear surface of the wafer W.

Moreover, when the wafer W is to be removed from the electrostatic chuck 23, the supplied helium gas pressure is decreased earlier than the applied voltage so as to prevent separation of the wafer W from the electrostatic chuck 23. Here, if the supplied helium gas pressure is sharply decreased, this would bring about a state in which only the electrostatic force acts on the wafer W, and as with the case shown in FIG. 2A, the wafer W is suddenly drawn toward the electrostatic chuck 23 to become distorted, and the distorted wafer W is attracted to and held on the electrostatic chuck 23. As a result, as with the case shown in FIG. 2A, a force that pulls the wafer W back toward the center acts on the wafer W, and a stress is generated on the rear surface of the wafer W. As a reaction to this stress, a stress is generated on the attracting surface of the electrostatic chuck 23. This stress as well produces particles of ceramics, and the produced particles get stuck in the rear surface of the wafer W.

Figure 5A:
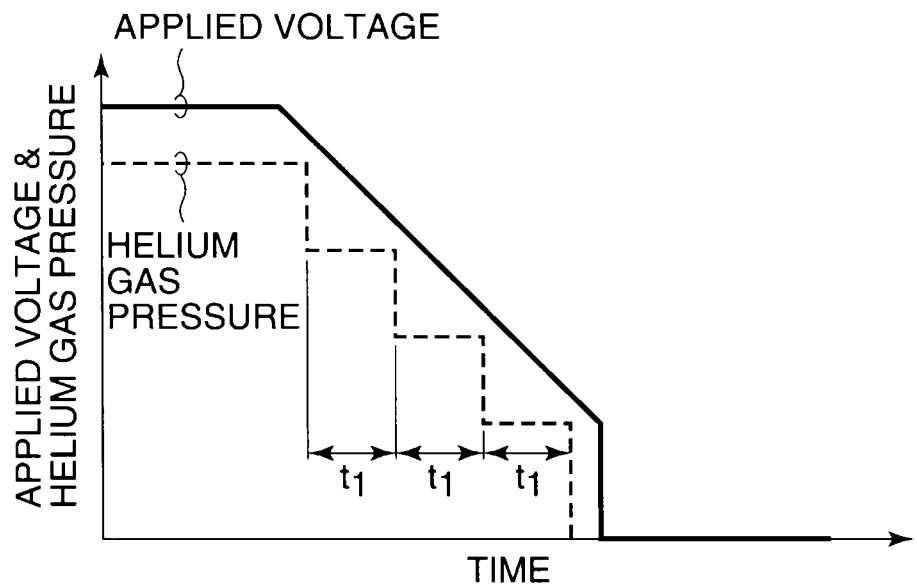

To cope with this, the substrate mounting and demounting method according to the present embodiment prevents the rear surface of the wafer W and the attracting surface of the electrostatic chuck 23 from rubbing against each other, and prevents a stress from being generated on the attracting surface of the electrostatic chuck 23 when the wafer W is removed from the electrostatic chuck 23. Specifically, as shown in FIG. 5A, when the wafer W is removed from the electrostatic chuck 23, the applied voltage is decreased while being gradually changed, and the supplied helium gas pressure is decreased in a staircase pattern (in stages) in response to the decrease in the applied voltage.

By decreasing the applied voltage while gradually changing the same, the wafer W can be gradually released, and prevented from being suddenly deformed due to an internal stress. This can prevent the rear surface of the wafer W from rubbing against the attracting surface of the electrostatic chuck 23 hard.

Moreover, because the supplied helium gas pressure is decreased in a staircase pattern in response to the increase in the applied voltage, the difference between the electrostatic force and the separating force can be made small. Therefore, the electrostatic force acting on the wafer W can be significantly relieved, and when the wafer W is removed from the electrostatic chuck 23, the wafer W can be prevented from becoming distorted. This can prevent a stress from being generated on the attracting surface of the electrostatic chuck 23.

As a result, structurally fragile parts of the attracting surface of the electrostatic chuck 23 are not broken, and particles of ceramics are not produced, and hence particles can be prevented from getting stuck in the rear surface of the wafer W.

Moreover, the substrate mounting and demounting method according to the present embodiment provides control such that the separating force does not exceed the electrostatic force when decreasing the applied voltage while gradually changing the same. Specifically, the supplied helium gas pressure is controlled so that the separating force Q can satisfy the above expression (1).

Further, the substrate mounting and demounting method according to the present embodiment provides control so that when the supplied helium gas pressure is decreased in a staircase pattern, the supplied helium gas pressure can be maintained at a constant value for a predetermined time period t1 for example, at least 10 seconds in each stage as shown in FIG. 5A.

Figure 5B:
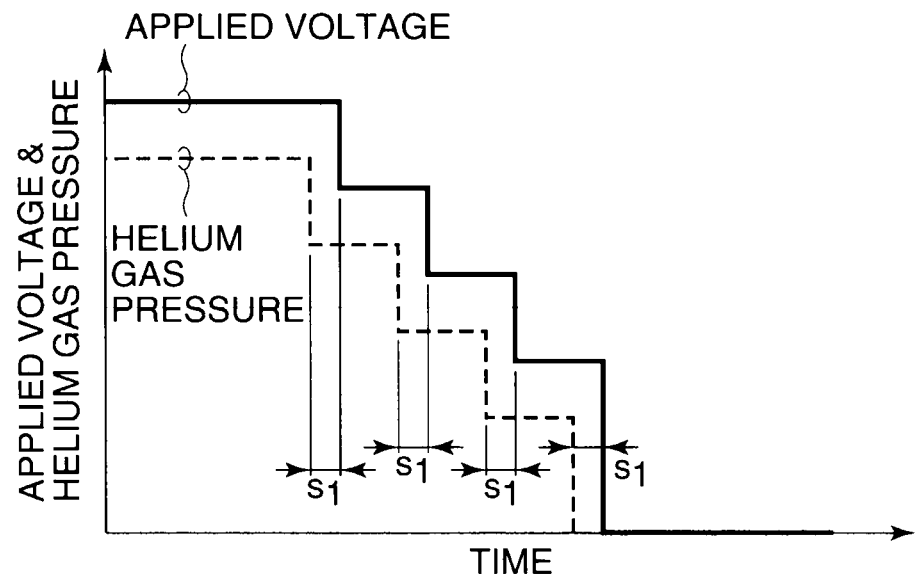

Moreover, the substrate mounting and demounting method according to the present embodiment preferably decreases the applied voltage in stages when decreasing the applied voltage while gradually changing the same as shown in FIG. 5B. The number of stages in which the applied voltage is decreased is preferably the same as the number of stages in which the supplied helium gas pressure is decreased, and also, the duration of each stage in which the applied voltage is decreased is preferably the same as the duration of each stage in which the supplied helium gas pressure is decreased.

Further, when decreasing the applied voltage in stages, the substrate mounting and demounting method according to the present embodiment preferably completes each stage in which the supplied helium gas pressure is decreased later than, for example as shown in FIG. 5B, a time period s1 later than the corresponding stage in which the applied voltage is decreased. This can reliably prevent the separating force from exceeding the electrostatic force when the wafer W is removed from the electrostatic chuck 23.

It should be noted that the number of stages in which the supplied helium gas pressure is decreased is preferably limited to a few, for example, two or three as is with the case where the supplied helium gas pressure is increased.

Figure 6:
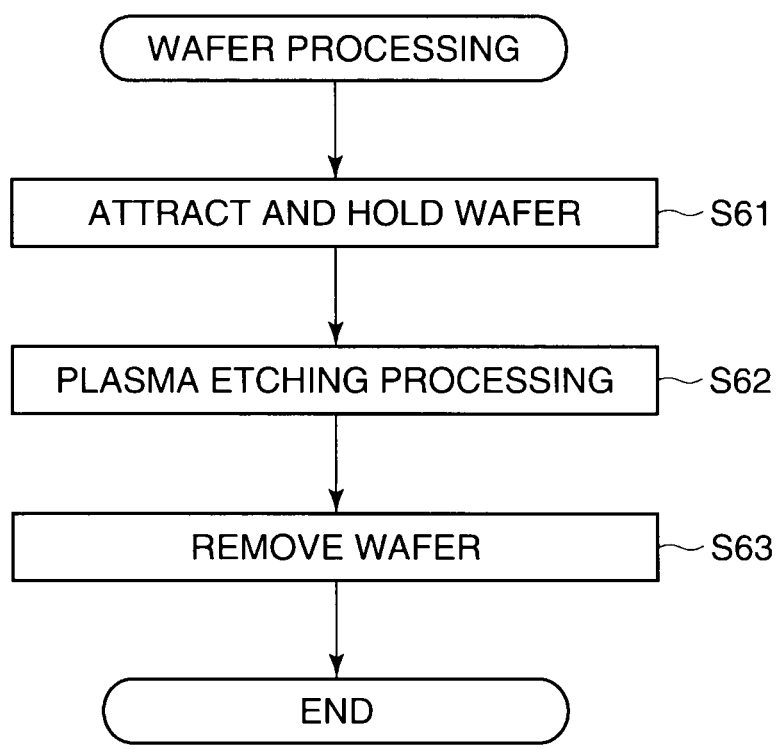
FIG. 6 is a flowchart showing the procedure of wafer processing using the substrate mounting and demounting method according to the present embodiment.

FIG. 6 is a flowchart of showing the procedure of wafer processing using the substrate mounting and demounting method according to the present embodiment.

Referring to FIG. 6, first, the wafer W is transferred into the chamber 11 of the substrate processing apparatus 10 and mounted on the susceptor 12, and then the wafer W is attracted to and held on the electrostatic chuck 23 (step S61).

At this time, the applied voltage and the pressure of the supplied helium gas are controlled as shown in FIG. 3A or FIG. 3B.

Then, the pressure in the chamber 11 is reduced while the applied voltage is continuously applied to the electrostatic electrode plate 22, and the helium gas is continuously supplied to the heat transmission gap, and plasma is produced from the processing gas introduced into the processing chamber 15, whereby the wafer W is subjected to the plasma etching processing (step S62).

After the plasma etching processing is completed, the wafer W is removed from the electrostatic chuck 23 (step S63). At this time, the applied voltage and the pressure of the supplied helium gas are controlled as shown in FIG. 5A or FIG. 5B.

Then, the wafer W is transferred out from the chamber 11, followed by the process terminating.

According to the substrate mounting and demounting method, when the wafer W is attracted to and held on the electrostatic chuck 23, the applied voltage is increased while being gradually changed, and the pressure of the supplied helium gas is increased in stages in response to the increase in applied voltage. Also, when the wafer W is removed from the electrostatic chuck 23, the applied voltage is lowered while being gradually changed, and the pressure of the supplied helium gas is decreased in stages in response to the drop in applied voltage. This can make a difference between electrostatic force and dividing force small, and thus prevent the wafer W from becoming distorted. As a result, a stress can be prevented from being generated on the attracting surface of the electrostatic chuck 23, and fine particles can be prevented from getting stuck in the rear surface of the wafer W.

Although the substrates subjected to the plasma etching processing by the substrate processing apparatus that implements the substrate mounting and demounting method according to the above described embodiment are wafers for semiconductor devices, the substrates are not limited to them and rather may instead be any of various glass substrates used in LCDs (Liquid Crystal Displays), FPDs (Flat Panel Displays), or the like, photomasks, CD substrates, printed substrates, or the like.

While the present invention has been described with reference to the exemplary embodiment, it is to be understood that the invention is not limited to the above described exemplary embodiment.

It is to be understood that the object of the present invention may also be accomplished by supplying a computer with a storage medium in which a program code of software, which realizes the functions of the above described embodiment is stored, and causing a CPU of the computer to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a medium capable of storing the above program code, for example, a RAM, an NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, or a DVD+RW), a magnetic tape, a nonvolatile memory card, and a ROM. Alternatively, the program code may be supplied to a computer by downloading from another computer, a database, or the like, not shown, connected to the Internet, a commercial network, a local area network, or the like.

Further, it is to be understood that the functions of the above described embodiment may be accomplished not only by executing a program code read out by a computer, but also by causing an OS (an operating system) or the like which operates on a CPU to perform a part or all of the actual operations based on instructions of the program code.

Further, it is to be understood that the functions of the above described embodiments may be accomplished y writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program code executed by an interpreter, or a script data supplied to an OS.

Working examples of the present invention will now be described.

In the substrate processing apparatus 10 shown in FIG. 1, the plasma etching processing was carried out on one lot of (25) wafers W one by one. When the plasma etching processing was carried out on the 22nd and 25th wafers W, the applied voltage was increased in stages as shown in FIG. 3B when the wafers W were attracted to and held on the electrostatic chuck 23. When the plasma etching processing was carried out on the other the wafers W, the applied voltage was sharply increased when the wafers W were attracted to and held on the electrostatic chuck 23.

After that, particles being present on rear surfaces of the wafers W were counted using an optical particle counter, and it was found that the numbers of particles present on the rear surfaces of the 22nd and 25th wafers W were 3000 to 5000, whereas the numbers of particles present on the rear surfaces of the other wafers W were 6000 to 7000. It was thus found that by increasing the applied voltage in stages, the wafers W can be prevented from becoming distorted and being attracted to and held on the electrostatic chuck 23, and hence a stress can be prevented from being generated on the attracting surface of the electrostatic chuck 23, so that attachment of particles to the rear surfaces of the wafers W can be prevented.

It should be noted that when the plasma etching processing was carried out on the 22nd and 25th wafers W, the supplied helium gas pressure was not increased in stages, but it could be easily expected that if the supplied helium gas pressure was increased in stages, distortion of the wafers W would be prevented more reliably, and hence the number of particles present on the rear surfaces of the other wafers W would be reduced to less than 3000.

What is claimed is:

1. A substrate mounting method implemented by a substrate processing apparatus, which has an electrostatic chuck that has therein an electrode plate, said mounting method comprising:

applying a DC voltage to the electrode plate;

attracting and holding a substrate through an electrostatic force generated due to the applied DC voltage;

supplying with a heat-transmitting gas supply unit a heat-transmitting gas into a gap between the attracted and held substrate and the electrostatic chuck; and during mounting the substrate to the electrostatic chuck, when increasing the DC voltage applied to the electrode plate while gradually changing the same, increasing a pressure of the supplied heat-transmitting gas in a staircase pattern in response to the increase in the DC voltage.

2. A substrate mounting method according to claim 1, wherein a separating force that separates the substrate from the electrostatic chuck, which is given to the substrate by the supplied heat-transmitting gas, never exceeds the electrostatic force.

3. A substrate mounting method according to claim 1, wherein the DC voltage is increased in another staircase pattern.

4. A substrate mounting method according to claim 1, wherein in each stage in which the pressure of the heat-transmitting gas is increased, the pressure of the supplied heat-transmitting gas is maintained at a constant value for at least 10 seconds.

5. A substrate mounting method according to claim 1, wherein the substrate is comprised mainly of silicon, and a contact portion of the electrostatic chuck which attracts and contacts the substrate is covered with ceramics.

6. A substrate demounting method implemented by a substrate processing apparatus, which has an electrostatic chuck that has therein an electrode plate to which a DC voltage is applied, and attracts and holds a substrate through an electrostatic force generated due to the applied DC voltage, and a heat-transmitting gas supply unit that supplies a heat-transmitting gas into a gap between the attracted and held substrate and the electrostatic chuck, the demounting method comprising:

during demounting of the substrate from the electrostatic chuck, when decreasing the DC voltage applied to the electrode plate while gradually changing the same after causing the substrate to be attracted to and held on the electrostatic chuck and supplying the heat-transmitting gas into the gap between the attracted and held substrate and the electrostatic chuck, decreasing a pressure of the supplied heat-transmitting gas in a staircase pattern in response to the decrease in the DC voltage.

7. A substrate demounting method according to claim 6, wherein a separating force that separates the substrate from the electrostatic chuck, which is given to the substrate by the supplied heat-transmitting gas, never exceeds the electrostatic force.

8. A substrate demounting method according to claim 6, wherein the DC voltage is decreased in another staircase pattern.

9. A substrate demounting method according to claim 6, wherein in each stage in which the pressure of the heat-transmitting gas is decreased, the pressure of the supplied heat-transmitting gas is maintained at a constant value for at least 10 seconds.

10. A substrate demounting method according to claim 6, wherein the substrate is comprised mainly of silicon, and a contact portion of the electrostatic chuck which attracts and contacts the substrate is covered with ceramics.

11. A substrate mounting method according to claim 1, wherein said step of increasing the pressure of the heat-transmitting gas in the staircase pattern includes a step of increasing the pressure of the heat-transmitting gas to a first pressure value, a step of maintaining the pressure of the heat-transmitting gas at the first pressure value constantly and a step of increasing the pressure of the heat-transmitting gas to a second pressure value higher than the first pressure value.

12. A substrate mounting method according to claim 11, wherein said step of increasing the pressure of the heat-transmitting gas in the staircase pattern further includes a step of maintaining the pressure of the heat-transmitting gas at the second pressure value constantly after increasing the pressure of the heat-transmitting gas to the second pressure value.

13. A substrate mounting method according to claim 3, wherein said step of increasing the DC voltage in the other staircase pattern includes a step of increasing the DC voltage to a first voltage value, a step of maintaining the DC voltage at the first voltage value constantly and a step of increasing the DC voltage to a second voltage value higher than the first voltage value.

14. A substrate mounting method according to claim 13, wherein each said step in which the pressure of the heat-transmitting gas is increased is started later than each said corresponding step in which the applied voltage is increased.

15. A substrate mounting method according to claim 1, wherein the DC voltage is increased in a non-staircase pattern.

16. A substrate demounting method according to claim 6, wherein said step of decreasing the pressure of the heat-transmitting gas in the staircase pattern includes a step of decreasing the pressure of the heat-transmitting gas to a first pressure value, a step of maintaining the pressure of the heat-transmitting gas at the first pressure value constantly and a step of decreasing the pressure of the heat-transmitting gas to a second pressure value lower than the first pressure value.

17. A substrate demounting method according to claim 16, wherein said step of decreasing the pressure of the heat-transmitting gas in the staircase pattern further includes a step of maintaining the pressure of the heat-transmitting gas at the second pressure value constantly after decreasing the pressure of the heat-transmitting gas to the second pressure value.

18. A substrate demounting method according to claim 8, wherein said step of decreasing the DC voltage in the other staircase pattern includes a step of decreasing the DC voltage to a first voltage value, a step of maintaining the DC voltage at the first voltage value constantly and a step of decreasing the DC voltage to a second voltage value lower than the first voltage value.

19. A substrate demounting method according to claim 18, wherein each said step in which the pressure of the heat-transmitting gas is decreased is finished earlier than each said corresponding step in which the applied voltage is decreased.

20. A substrate demounting method according to claim 6, wherein the DC voltage is decreased in a non-staircase pattern.

* * * * *